United States Patent
Hooker et al.

(10) Patent No.: US 7,763,944 B2
(45) Date of Patent: Jul. 27, 2010

(54) SEMICONDUCTOR DEVICE AND METHOD OF MANUFACTURING SUCH A SEMICONDUCTOR DEVICE

(75) Inventors: Jacob C. Hooker, Kessel-Lo (BE); Robert Lander, Leuven (BE); Robertus Wolters, Eindhoven (NL)

(73) Assignee: NXP B.V., Eindhoven (NL)

( * ) Notice: Subject to any disclaimer, the term of this patent is extended or adjusted under 35 U.S.C. 154(b) by 302 days.

(21) Appl. No.: 11/574,245

(22) PCT Filed: Aug. 10, 2005

(86) PCT No.: PCT/IB2005/052646

§ 371 (c)(1),
(2), (4) Date: Nov. 12, 2007

(87) PCT Pub. No.: WO2006/021906

PCT Pub. Date: Mar. 2, 2006

(65) Prior Publication Data

US 2008/0211032 A1 Sep. 4, 2008

(30) Foreign Application Priority Data

Aug. 24, 2004 (EP) .................. 04104056
Sep. 16, 2004 (EP) .................. 04104489

(51) Int. Cl.
*H01L 27/092* (2006.01)

(52) U.S. Cl. .............. 257/369; 257/371; 257/204; 438/199; 438/200

(58) Field of Classification Search ............ 257/369, 257/204, 371; 438/199, 200
See application file for complete search history.

(56) References Cited

U.S. PATENT DOCUMENTS

| | | | |
|---|---|---|---|
| 6,171,910 B1 * | 1/2001 | Hobbs et al. ............ 438/275 |
| 6,967,131 B2 * | 11/2005 | Saenger et al. ......... 438/199 |
| 7,067,379 B2 * | 6/2006 | Wen et al. .............. 438/300 |
| 2006/0084217 A1 * | 4/2006 | Luo et al. ............... 438/199 |

* cited by examiner

*Primary Examiner*—Thinh T Nguyen

(57) ABSTRACT

The invention relates to a CMOS device (10) with an NMOST I and PMOST 2 having gate regions (1D,2D) comprising a compound containing both a metal and a further element. According to the invention the first and second conducting material both comprise a compound containing as the metal a metal selected from the group comprising molybdenum and tungsten and both comprise as the further element an element selected from the group comprising carbon, oxygen and the chalcogenides. Preferably both the first and second conducting material comprise a compound of molybdenum and carbon or oxygen. The invention also provides an attractive method of manufacturing such a device.

10 Claims, 2 Drawing Sheets

SEMICONDUCTOR DEVICE AND METHOD OF MANUFACTURING SUCH A SEMICONDUCTOR DEVICE

Figure 1:
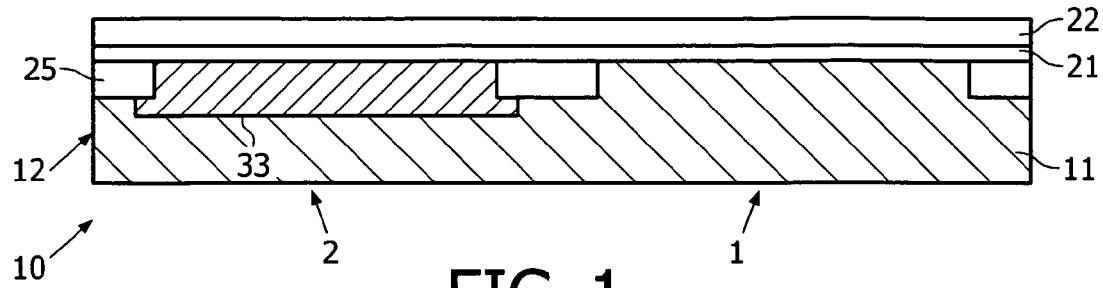
Figure 2:
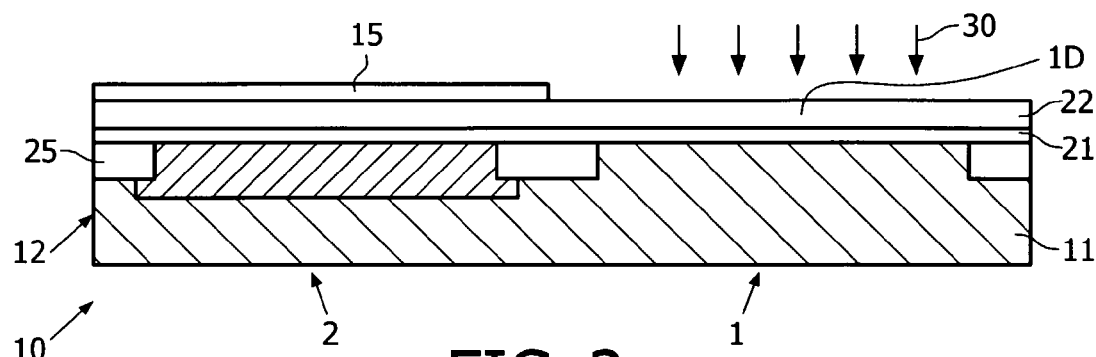
Figure 3:
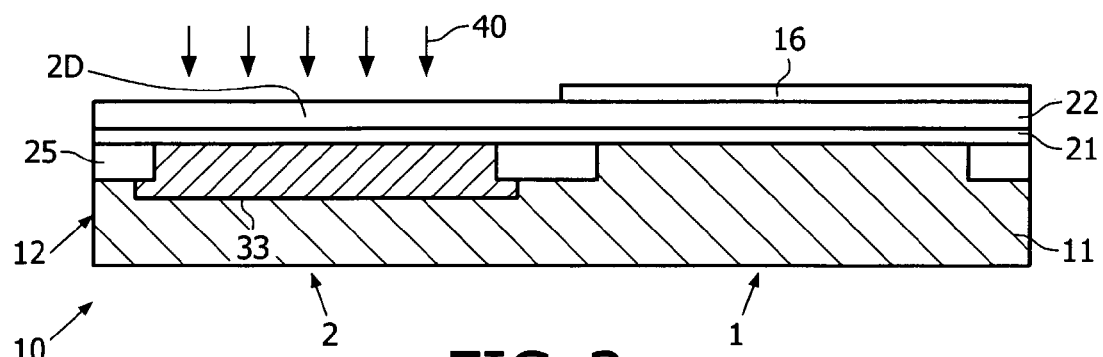
Figure 4:
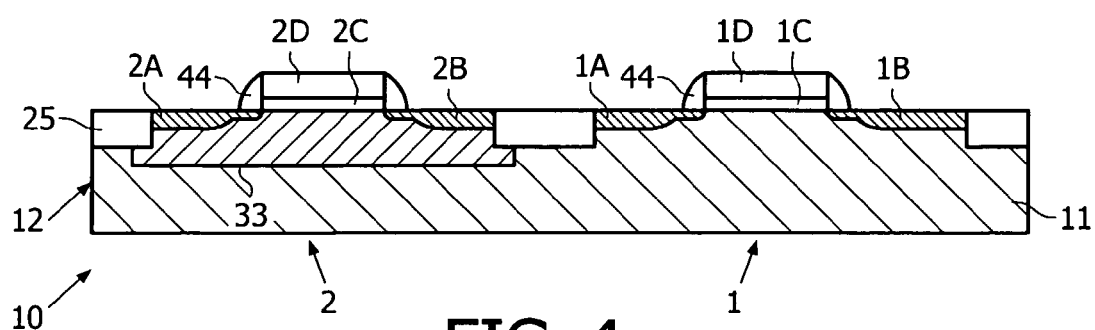

The invention relates to a semiconductor device with a substrate and a semiconductor body comprising a first field effect transistor with a first source and drain region and a first channel of a first conductivity type and with separated from the first channel by a first dielectric region a first gate region comprising a first conducting material and a second field effect transistor with a second source and drain region and a second channel of a second, opposite to the first, conductivity type and with separated from the second channel by a second dielectric region a second gate region comprising a second conducting material different from the first conducting material, wherein the first and second conducting material comprise a compound containing both a metal and a further element. In advanced CMOS (=Complimentary Metal Oxide Semiconductor) devices below the sub 0.1 micron region, the replacement of polysilicon gates by metal gates or alloys thereof is desirable for various reasons. The invention also relates to a method of manufacturing such a device.

A device as mentioned in the opening paragraph is known from U.S. Pat. No. 6,130,123 that has been published on Oct. 10, 2000. Therein various electrically conducting materials are described that are suitable for use in the NMOST (=N-type MOS Transistor) and PMOST of a CMOS device. Examples of metals or metal alloys that are suitable for the former of which the workfunction is about 4.2 eV are Ru, Zr, Nb, Ta, MoSi and TaSi. For the latter, having a workfunction of about 5.2 eV Ni, RuO2, MoN and TaN are suitable material among others.

A drawback of the known conducting materials is that they are not always very compatible with existing IC technology. This includes the requirement that the materials should be compatible with the materials of the gate stack comprising the materials of the gate dielectric, the capping layer and the spacers.

It is therefore an object of the present invention to avoid the above drawbacks and to provide a device which is very compatible with IC technology and easy to manufacture.

To achieve this, a device of the type mentioned in the opening paragraph is characterized in that the first and second conducting material both comprise a compound containing as the metal a metal selected from the group comprising molybdenum and tungsten and both comprise as the further element an element selected from the group comprising carbon, oxygen and the chalcogenides, the latter comprising S, Se and Te. On the one hand the material contains a metal that is very common in present IC technology, e.g. for conduction tracks and in particular for use a connection between conduction tracks at different levels. On the other hand the further elements in a device according to the invention provide several advantages. Firstly, they allow for a full coverage of the workfunction range desired, i.e. from about 4.1 eV to about 5.2 eV. Furthermore, this may be realized by having the metal in common for both the first and the second transistor which simplifies the manufacture. To the latter also contributes the fact that the conducting material may be formed using gaseous compounds of the further elements mentioned, e.g. CH4, O2 and H2Se.

In a preferred embodiment both the first and second conducting material comprise a compound of molybdenum and carbon or oxygen. These compounds are very suitable to obtain the objectives of the invention. In a first modification the first conductivity type comprises the n-type and the first conducting material comprises a compound of molybdenum and carbon and the second conducting material comprises a compound of molybdenum and oxygen. In another variant, in which the first conductivity type comprises the n-type, the first conducting material comprises a compound of molybdenum and oxygen with a higher oxygen content and in that the second conducting material comprises a compound of molybdenum and oxygen with a lower oxygen content. Since in this case both the N-metal and the P-metal can be formed with only two elements, the manufacture is relatively simple in particular when using a method of manufacturing according to the invention as described below.

A method of manufacturing a semiconductor device with a substrate and a semiconductor body comprising a first field effect transistor with a first source and drain region and a first channel of a first conductivity type and with separated from the first channel by a first dielectric region a first gate region comprising a first conducting material and a second field effect transistor with a second source and drain region and a second channel of a second, opposite to the first, conductivity type and with separated from the second channel by a second dielectric region a second gate region comprising a second conducting material different from the first conducting material, wherein for the first and second conducting materials a material is chosen comprising a compound containing both a metal and a further element, is according to the invention characterized in that for the first and second conducting material both a material is chosen comprising a compound containing as the metal a metal selected from the group comprising molybdenum and tungsten and comprising as the further element an element selected from the group comprising carbon, oxygen and the chalcogenides. In this way a semiconductor device according to the invention is obtained.

In a preferred embodiment of the method according to the invention for both the first and second conducting material a material is chosen comprising a compound of molybdenum and carbon or oxygen.

A first modification is characterized in that on the first and second dielectric regions a layer of the metal is formed which is at the location of the first dielectric region made to react with a gaseous compound of the further element while the layer of the metal at the location of the second dielectric region is protected against the gaseous compound by a mask and which after removal of the mask is at the location of the second dielectric region made to react with a gaseous compound of the further element while the layer of the metal at the location of the first dielectric region is protected against the gaseous compound by a further mask. In this way, only a single metal layer needs to be deposited to form the conducting material. Furthermore, a gaseous compound containing e.g. oxygen can be used to locally transfer the metal in the compound with the desired workfunction while the other gate region is protected by a mask which is impermeable for such a gaseous compound. A suitable material for the latter is TiN or MoN. While it is preferred to do the reaction with the gaseous compound at the layer stage, it also may be done if the gate regions already have been formed from a layer (structure) by etching.

Another modification is characterized in that on the first and second dielectric regions a layer of the first conducting material is deposited which is at the location of the second dielectric region made to react with a gaseous compound of the further element while the layer of the first conducting material at the location of the first dielectric region is protected against the gaseous compound by a mask. In this way only one masking step is needed which simplifies the manufacturing. The layer of the first conducting material may be formed by a physical deposition technique like sputtering in a gaseous atmosphere, e.g. sputtering of Mo in an O2 containing atmosphere, or by another technique like CVD (=Chemical Vapor Deposition).

Preferably the layer of the first conducting material is formed by depositing a layer of the metal and reacting the metal layer with a gaseous compound of the further element. In particular if the metal layer has a porous structure or forms a very thin film (e.g. with a thickness <10 nm), it may easily react with gasses like CH4 or O2 or the like.

Figure 5:
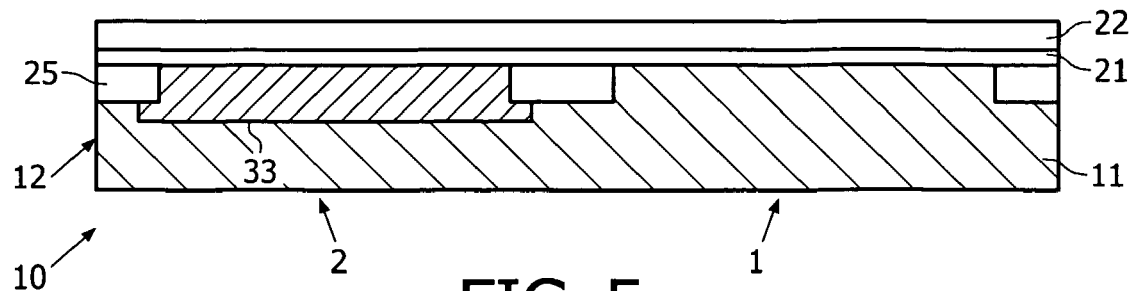
Figure 6:
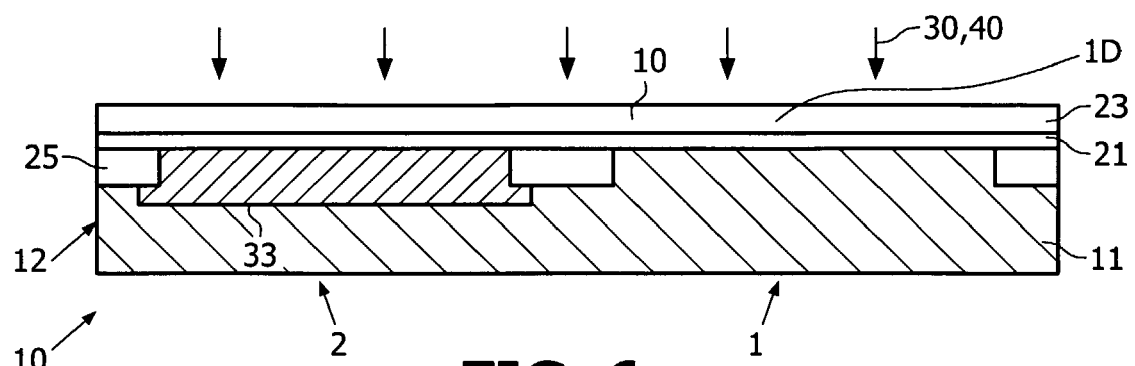
Figure 7:
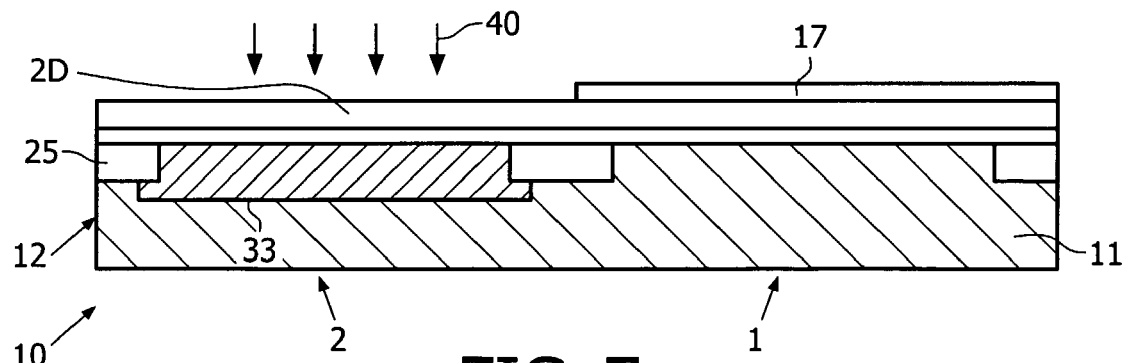
Figure 8:
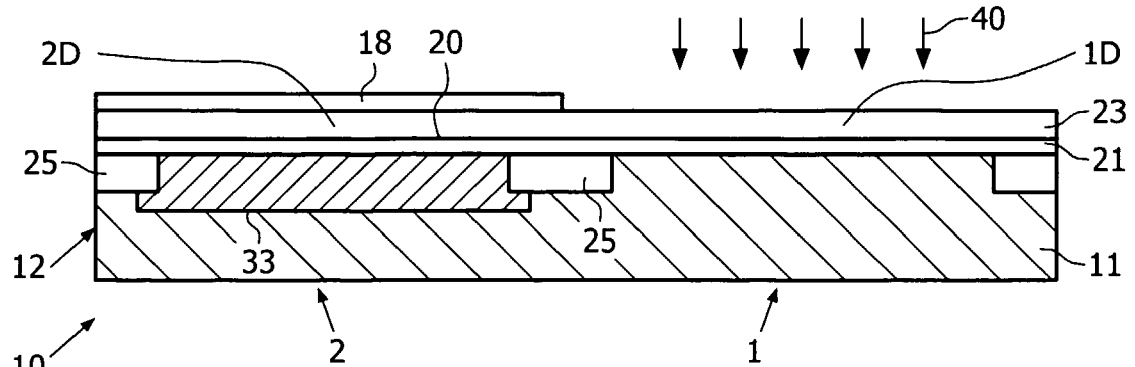

These and other aspects of the invention will be apparent from and elucidated with reference to the embodiments described hereinafter, to be read in conjunction with the drawing, in which FIGS. 1 through 4 are sectional views of a first example of a semiconductor device according to the invention at various stages in the manufacture of the device by means of a first embodiment of a method in accordance with the invention, FIGS. 5 through 7 are sectional views of a second example of a semiconductor device according to the invention at various stages in the manufacture of the device by means of a second embodiment of a method in accordance with the invention, and FIG. 8 is a sectional views of a third example of a semiconductor device according to the invention at a relevant stage in the manufacture of the device by means of a third embodiment of a method in accordance with the invention.

The Figures are diagrammatic and not drawn to scale, the dimensions in the thickness direction being particularly exaggerated for greater clarity. Corresponding parts are generally given the same reference numerals and the same hatching in the various Figures.

FIGS. 1 through 4 show sectional views of a first example of a semiconductor device according to the invention at various stages in the manufacture of the device by means of a first embodiment of a method in accordance with the invention. The (nearly) finished device 10 (see FIG. 4) comprises a semiconductor body 12, here of p-type silicon which here is formed by a substrate 11 and in which a first transistor 1 is formed as an NMOST. In a N-well region 33 a second transistor 2 is formed as a PMOST. The transistors 1,2 comprise source and drain regions 1A,1B,2A,2B, respectively of the n- and p-type conductivity, dielectric regions 1C,2C, here comprising silicondioxide, and gate regions 1D,2D. In the surface of the semiconductor body 12 isolation regions 25 are formed, here in the form of trenches filled with silicondioxide (or with another gate dielectric, e.g. a metal oxide).

The gate region ID of the NMOST 1 comprises in this example a compound comprising Mo and C and with a composition of $MoC_x$ where $x \leq 1$. e.g. $Mo_2C$, of which the work function is about 3.6 to 3.8 eV and thus close to the optimal value of about 4.2 eV. The gate region 2D of the PMOST 2 comprises in this example a compound comprising Mo and O and with a composition of $MoO_x$, where $x \leq 2$, e.g. $MoO_2$, of which the work function is about 4.6 to 5.5 eV and thus can be tuned to the optimal value of about 5.2 eV.

The device 10 is manufactured as follows. Starting point (see FIG. 1) is a p-type substrate 11 in which the n-well 33 and the STI (=Shallow Trench Isolation) regions 25 are formed. Next a dielectric layer 21 is formed and on thereon a metal layer 22, here comprising porous Mo, is deposited by vapor deposition.

Subsequently (see FIG. 2) a mask 15 is formed at the location of the PMOST 2 and the metal layer 22 is under heating to T>250 degrees Celsius exposed to a gaseous compound 30 comprising C, here CH4, preferably also aided by plasma. The metal layer 22 is at the location of the NMOST 1 converted to the desired compound $Mo_2C$, or to a compound with a composition in the range indicated before which will form later on the gate region 1D. The mask 15 comprises here TiN and is formed by deposition of a TiN layer which is patterned using photolithography and etching.

Hereinafter, a similar procedure is done (see FIG. 3) for the PMOST 2. Now the NMOST 1 is protected by a mask 16 and the Mo layer 22 is exposed to a gaseous compound comprising O, here O2 under heating to T>250 degrees Celsius. The conditions are such that the Mo layer 22 is locally converted to $MoO_2$ (or to a compound with a composition in the range indicated before) which will form the gate region 2D of the PMOST 2.

The manufacturing is then continued in a usual manner in that gate stacks are formed by photolithography and etching. Formation of shallow parts of the source and drain regions 1A,1B,2A,2B is followed by the formation of spacers 44 and the deep source and drain implantations. Further steps like the deposition of pre-metal dielectric, patterning thereof, contact metal deposition and patterning thereof are not shown in the drawing.

FIGS. 5 through 7 are sectional views of a second example of a semiconductor device according to the invention at various stages in the manufacture of the device by means of a second embodiment of a method in accordance with the invention. The device 10 of this example is identical to that of the previous example. The first step (see FIG. 5) is the same as described above. Next (see FIG. 6) the metal layer 22 comprising porous Mo is completely exposed to the treatment with the gaseous compound 30 comprising CH4. In this way the metal layer 22 is converted in both transistors 1,2 to $Mo_2C$. Then (see FIG. 7) a mask 17 is formed in the region of the NMOST 1 and the $Mo_2C$ layer is treated with a gaseous compound 40 comprising oxygen and converted to $MoO_2$. In this process the C atoms in the gate region 2D are converted to a gaseous compound of C and O and released from the gate region 2D.

The manufacturing is continued as described in the first example.

FIG. 8 is a sectional views of a third example of a semiconductor device according to the invention at a relevant stage in the manufacture of the device by means of a third embodiment of a method in accordance with the invention. In this example both gate regions 1D,2D comprise a compound of Mo and O. The gate region 1D of the NMOST 1 comprises $MoO_3$ which has a work function of 3.9 to 4.1 eV and thus is nearly optimal for this transistor. The gate region 2D of the PMOST 2 comprises $MoO_2$ as in the previous examples. The manufacture starts as shown in FIG. 5 and described above. The Mo layer 22 then is then (see FIG. 6) converted into $MoO_2$ layer 23 using the treatment with gaseous compound 40 containing O. Next (see FIG. 8) the PMOST 2 area is protected by mask 18 and the $MoO_2$ layer 23 is locally—at the location of the NMOST 1—further oxidized to $MoO_3$, the latter material having a workfunction of about 3.9 to 4.1 eV which is nearly optimal for the latter transistor 1. The manufacture then continues as described before.

Furthermore, good results were also obtained with a compound of Mo and oxygen as the conducting material for a PMOST and with a compound of Mo and a chalcogenide like Tellurium for a NMOST. The first mentioned compound was obtained by local oxidation of a Mo layer, the second mentioned compound was obtained by locally implanting Tellurium ions in the Mo layer.

It will be obvious that the invention is not limited to the examples described herein, and that within the scope of the invention many variations and modification are possible to those skilled in the art. It is for example to be noted that also mixed compounds, i.e. compound containing more than two of the elements mentioned, e.g. a compound comprising Mo, C and O, can advantageously be applied.

The invention claimed is:
1. Semiconductor device with a substrate and a semiconductor body comprising
   a first field effect transistor with a first source and drain region and a first channel of a first conductivity type and with separated from the first channel by a first dielectric region a first gate region comprising a first conducting material and
   a second field effect transistor with a second source and drain region and a second channel of a second, opposite to the first, conductivity type and with separated from the second channel by a second dielectric region a second gate region comprising a second conducting material different from the first conducting material;
   wherein the first and second conducting material comprise a compound containing both a metal and a further element, characterized in that the first and second conducting material both comprise a compound containing as the metal a metal selected from the group comprising molybdenum and tungsten and both comprise as the further element an element selected from the group comprising carbon, oxygen and the chalcogenides, wherein the first conducting material and the second conducting material include only two elements.

2. Semiconductor device according to claim 1, characterized in that both the first and second conducting material comprise a compound of molybdenum and carbon or oxygen.

3. Semiconductor device according to claim 1, characterized in that the first conductivity type comprises the n-type and in that the first conducting material comprises a compound of molybdenum and oxygen with a higher oxygen content and in that the second conducting material comprises a compound of molybdenum and oxygen with a lower oxygen content.

4. Semiconductor device according to claim 3, characterized in that the first conducting material comprises $MoO_3$ and the second conducting material comprises $MoO_2$.

5. Semiconductor device according to claim 4, wherein the $MoO_3$ has a work function of about 3.9 to 4.1 eV.

6. Semiconductor device with a substrate and a semiconductor body comprising
   a first field effect transistor with a first source and drain region and a first channel of a first conductivity type and with separated from the first channel by a first dielectric region a first gate region comprising a first conducting material and
   a second field effect transistor with a second source and drain region and a second channel of a second, opposite to the first, conductivity type and with separated from the second channel by a second dielectric region a second gate region comprising a second conducting material different from the first conducting material;
   wherein the first and second conducting material comprise a compound containing both a metal and a further element, characterized in that the first and second conducting material both comprise a compound containing as the metal a metal selected from the group comprising molybdenum and tungsten and both comprise as the further element an element selected from the group comprising carbon, oxygen and the chalcogenides, wherein the first conducting material comprises a chalcogenide as the further element.

7. Semiconductor device according to claim 6, characterized in that the chalcogenides comprise S, Se and Te.

8. Semiconductor device according to claim 6, characterized in that the second conducting material comprises oxygen as the further element.

9. Semiconductor device with a substrate and a semiconductor body comprising
   a first field effect transistor with a first source and drain region and a first channel of a first conductivity type and with separated from the first channel by a first dielectric region a first gate region comprising a first conducting material and
   a second field effect transistor with a second source and drain region and a second channel of a second, opposite to the first, conductivity type and with separated from the second channel by a second dielectric region a second gate region comprising a second conducting material different from the first conducting material;
   wherein the first and second conducting material comprise a compound containing both a metal and a further element, characterized in that the first and second conducting material both comprise a compound containing as the metal a metal selected from the group comprising molybdenum and tungsten and both comprise as the further element an element selected from the group comprising carbon, oxygen and the chalcogenides, wherein the first conducting material comprises $MoC_x$ where $x \leq 1$, and wherein the second conducting material comprises $MoO_y$ where $y \leq 2$.

10. Semiconductor device according to claim 9, wherein the $MoC_x$ has a work function of about 3.6 to 3.8 eV and the $MoO_y$ has a work function of about 4.6 to 5.5 eV.

* * * * *